(12) United States Patent
Suzuki

(10) Patent No.: US 8,253,246 B2
(45) Date of Patent: Aug. 28, 2012

(54) WIRING STRUCTURE AND ELECTRONIC DEVICE DESIGNED ON BASIS OF ELECTRON WAVE-PARTICLE DUALITY

(76) Inventor: Takashi Suzuki, Yokohama (JP)

( * ) Notice: Subject to any disclaimer, the term of this patent is extended or adjusted under 35 U.S.C. 154(b) by 813 days.

(21) Appl. No.: 12/087,155

(22) PCT Filed: Dec. 27, 2006

(86) PCT No.: PCT/JP2006/326095
§ 371 (c)(1),
(2), (4) Date: Jun. 27, 2008

(87) PCT Pub. No.: WO2007/077884
PCT Pub. Date: Jul. 12, 2007

(65) Prior Publication Data
US 2009/0050357 A1   Feb. 26, 2009

(30) Foreign Application Priority Data

Dec. 28, 2005   (WO) ................. PCT/JP2005/024266

(51) Int. Cl.
*H01L 21/302* (2006.01)
(52) U.S. Cl. ........ 257/734; 257/773; 257/775; 174/261; 430/5
(58) Field of Classification Search ................ 257/734, 257/773, 775; 174/261; 430/5
See application file for complete search history.

(56) References Cited

U.S. PATENT DOCUMENTS

2004/0072415 A1   4/2004   Fukumoto

FOREIGN PATENT DOCUMENTS

| JP | A-63-164337 | 7/1988 |
|---|---|---|
| JP | A-06-005591 | 1/1994 |
| JP | A-06-005782 | 1/1994 |
| JP | A-09-069622 | 3/1997 |
| JP | A-10-125936 | 5/1998 |
| JP | A-10-209428 | 8/1998 |
| JP | A-2001-156069 | 6/2001 |
| JP | A-2004-134594 | 4/2004 |

OTHER PUBLICATIONS

De Broglie, "Waves and Quanta," *Nature*, Oct. 13, 1923, vol. 112, No. 2815, pp. 540.

*Primary Examiner* — Long Pham
(74) *Attorney, Agent, or Firm* — Oliff & Berridge, PLC

(57) ABSTRACT

According to a simultaneous duel model that a de Broglie wave accompanies an electron drift-moving in an electron circuit, wiring is considered as a waveguide of the average de Broglie wave and design was performed by reducing the resistance value at bending portion of the wiring. Furthermore, by providing a micro-structure having a wave suppressing function of average de Broglie wave on the boundary between the metal electrode and the semiconductor electrode, so that electron transmitting probability at the boundary is increased. This improves electric feature of a macro structure portion which may cause a local heating such as a bending corner of wiring contained in the electronic circuit such as an IC and an LSI or a boundary between the metal electrode and the semiconductor electrode.

25 Claims, 8 Drawing Sheets (A)

(B)

(C)

Fig. 3
| w  Θ | 0.5 μm | 1 μm | 10 μm |
|---|---|---|---|
| 100° | 0.18 μm | 0.36 μm | 3.64 μm |
| 135° | 0.10 μm | 0.20 μm | 1.99 μm |
Fig. 4
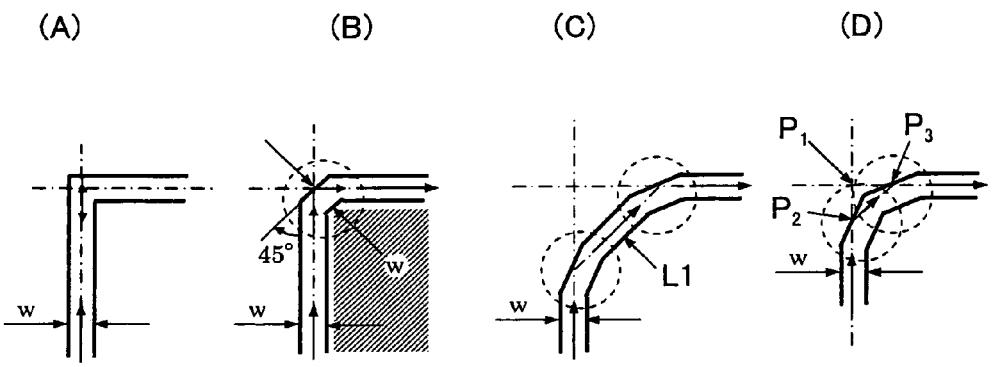
Fig. 5
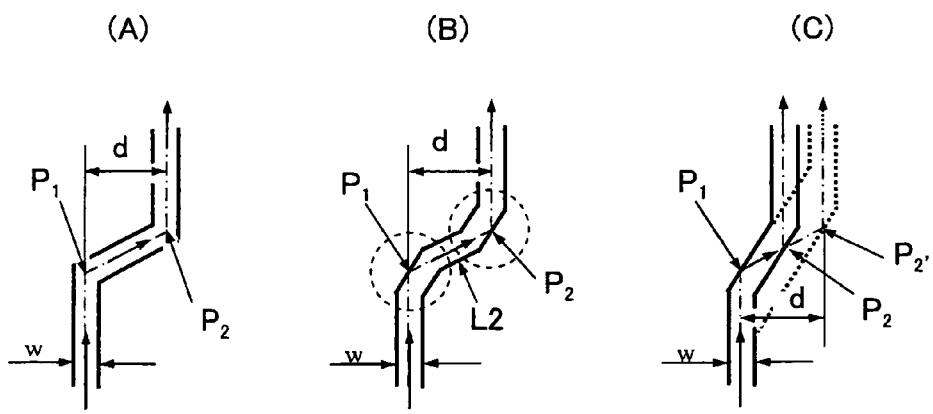

(A)

(B)

(C)

(D)

(A)

(B)

WIRING STRUCTURE AND ELECTRONIC DEVICE DESIGNED ON BASIS OF ELECTRON WAVE-PARTICLE DUALITY

TECHNICAL FIELD

The present invention relates to a wiring structure designed by such a method that a macroscopic structure portion, which is possessed by an electronic circuit such as an IC and an LSI circuit, is designed on the basis of the microscopic property possessed by each of individual electrons, i.e., the wave-particle duality. Further, the present invention relates to an electronic device designed by using such a designing method and then produced.

BACKGROUND ART

The field of the study in relation to the physical properties of, for example, the dielectric substance, the magnetic substance, and the semiconductor is called "solid state physics". Quantum mechanics lies in the basis thereof. However, the wave nature of individual electrons has not been hitherto applied to design the macroscopic structure portion possessed by the electronic circuit including the semiconductor such as the IC and the LSI circuit. The macroscopic structure portion of the electronic circuit herein means a bent corner portion of the wiring structure and a flat interface between a metal electrode and a semiconductor electrode like that. The following references are cited:

Japanese Patent Application Laid-open No. 6-005782 (Patent Reference 1);

L. de Broglie, Nature Vol. 112, 540 (1923) (Non-patent Reference 1).

DISCLOSURE OF THE INVENTION

Task to be Solved by the Invention

When comparing wiring portions of an optical circuit and an optical IC with those of an electronic circuit, an IC, and an LSI circuit, while the wiring portions of the optical circuit and the optical IC are designed on the assumption that light is regarded as a wave from the beginning, the wiring portions of the electronic circuit, the IC, and the LSI circuit are designed without considering the wave nature possessed by individual electrons at all. In the case of the IC, in particular the LSI circuit, the wiring portions are basically constructed by two types of linear or straight wiring structures which are parallel to the sides of a quadrangle in order to closely assemble many functions into a quadrilateral area having a small areal size. When a bent corner of a narrow width wiring structure is bent perpendicularly, the following fact is clearly appreciated. That is, an average de Broglie wave, which is accompanied with electrons as described later on, is dominantly reflected at the bent corner to the direction in which the wave originally comes, but the average de Broglie wave hardly enters the straight portion disposed beyond the right-angled bend. The fact that "the average de Broglie wave, which leads the electron, is reflected" means that the electrons themselves may be also reflected by the wall of the wiring structure disposed in the front. Although depending on the electric potential gradient, the following situation may occur that the collision with the wall of the wiring structure is repeated several times until one electron is successfully allowed to advance and enter the straight portion disposed beyond the right-angled bend. In a macroscopic viewpoint as well, this fact results in an increase in the resistance of the IC and the LSI circuit. Therefore, the heat generation is caused thereby, and the rising and falling characteristics of individual signals are deteriorated. At present, the minimum line width of the wiring structure is about 90 nm. It is approved that the minimum line width will be 60 nm to 45 nm in near future. Even when the wiring structure has a straight form, if the width is about 45 nm, then there is such a possibility that an electron may collide with the wall of the wiring structure within only one mean free path. The more the width of the wiring structure becomes narrow, the more the bent corner of the wiring structure especially tends to cause the heat generation. It is necessary to provide an artifice for the design in order to decrease the resistance at the relevant portion.

The structural portion, which has the largest resistance value in the circuit of the IC or the LSI circuit, may be a joining portion between a metal electrode and a semiconductor electrode, the joining portion being disposed at the end of the metal wiring. The joining surface between the metal electrode and the semiconductor electrode is flat, at which the electric conductivity is suddenly changed. Therefore, a de Broglie wave, which is associated with an electron moving in the direction opposite to a hole, tends to be reflected thereby. Therefore, even when the electron comes toward the joining surface, then the electron not necessarily pass therethrough successfully once, and the electron repeats the reflection and the reentry several times. If the number of times of the incidence and the reflection is increased, then the stay of electrons arises, and this situation results in a larger amount of the heat generation and the deterioration of the signal waveform. Unless even a part of the de Broglie wave is propagated or transmitted through the joining surface toward the semiconductor, the associated electron cannot enter the semiconductor as well. It is necessary to provide an artifice for the design in order to decrease the resistance at this portion.

Solution for the Task

According to a first aspect of the present invention, there is provided a wiring structure comprising a first straight portion which extends in a first direction with a first width on both sides of a first center line extending in the first direction; a second straight portion which extends in a second direction, different from the first direction, with a second width on both sides of a second center line extending in the second direction; and a bent portion which has a predetermined width and which connects one end of the first straight portion and one end of the second straight portion so that an angle formed by the first direction and the second direction is larger than 90 degrees and smaller than 180 degrees; wherein the first center line of the first straight portion and the second center line of the second straight portion intersect at an outer edge portion of the bent portion which defines the predetermined width. The description "the first center line and the second center line intersect at the outer edge portion of the bent portion" resides in the concept which also includes the fact that the intersection is made in a band-shaped area having a certain width (for example, about ¼ of the width of the bent portion) from the outer edge portion of the bent portion, in addition to the fact that the center lines intersect on the outer edge portion of the bent portion.

According to the first aspect of the present invention, an average de Broglie wave, which propagates along the center line of the wiring structure, is suppressed from being reflected in the direction opposite to the direction of propagation. Therefore, it is possible to lower the resistance of the wiring structure. The direction of propagation of the average de Broglie wave has the same meaning as an average direction of motion of electrons each of which performs the drift motion.

In the wiring structure of the present invention, an angle formed by the first center line and the outer edge portion may be equal to an angle formed by the second center line and the outer edge portion. In this arrangement, it is possible to reduce the number of times of the reflection of the average de Broglie wave. Therefore, it is possible to lower the resistance of the wiring structure.

In the wiring structure of the present invention, a shape of the outer edge portion may be a straight line, or a shape of the outer edge portion may be a curved line. In any case, it is possible to reduce the number of times of the reflection of the average de Broglie wave, and it is possible to lower the resistance of the wiring.

In the wiring structure of the present invention, the wiring structure may be a wiring structure which is provided in an LSI circuit. In the case of the LSI circuit having a high wiring density in which the high integration is required, it is especially effective to use the wiring structure of the present invention in view of a countermeasure against the heat.

According to a second aspect of the present invention, there is provided a wiring structure comprising a first straight portion which extends in a first direction with a first width on both sides of a first center line extending in the first direction; a second straight portion which extends in a second direction, different from the first direction, with a second width on both sides of a second center line extending in the second direction; and a bent portion which has a curved form, which has a predetermined width, and which connects one end of the first straight portion and one end of the second straight portion so that an angle formed by the first direction and the second direction is 90 degrees, wherein the first center line of the first straight portion and the second center line of the second straight portion intersect at an outer edge portion, of the bent portion, which has a curved shape defining the predetermined width.

According to the second aspect of the present invention, it is possible to reduce the number of times of the reflection of the average de Broglie wave, and it is possible to lower the resistance of the wiring, in the wiring structure having the bent portion which is bent at the right angle as well.

According to a third aspect of the present invention, there is provided an electronic device comprising a first electronic material which has a first electric conductivity; and a second electronic material which has a second electric conductivity and which is arranged in contact with the first electronic material, wherein a plurality of projections are formed on an interface between the first electronic material and the second electronic material.

According to the third aspect of the present invention, it is possible to lower the internal resistance, and it is possible to suppress the heat generation, for example, in an electronic device such as a semiconductor device.

In the electronic device of the present invention, the first electronic material may be a semiconductor, and the second electronic material may be a metal forming an electrode. In this arrangement, it is possible to lower the resistance of the interface between the electrode and the semiconductor. Therefore, it is possible to suppress the heat generation of the semiconductor device. The semiconductor device generally means the electronic device which includes the semiconductor as a raw material, including, for example, a diode, a transistor, a light emitting diode, a semiconductor laser, an SRAM, a DRAM, a flash memory, a CCD, etc.

In the electronic device of the present invention, a shape of the projection formed on the interface may be a triangular pyramid, and/or a cross-sectional shape of the projection formed on the interface, which is taken along a plane perpendicular to the interface, may be a triangle or a quadrangle. In any one of these cases, it is possible to increase the number of times of the collision of the electron at the interface, and it is possible to lower the electric resistance of the interface. Therefore, it is possible to suppress the heat generation of the electronic device.

Effect of the Invention

When the wiring structure and the electronic device such as an LSI circuit etc. of the present invention are used on the assumption that the electric power consumption of them is lowered even by several percents as compared with the present situation, then it is possible to save an enormous amount of the energy in all over the world.

BRIEF DESCRIPTION OF THE DRAWINGS

FIG. 3 shows a table which summarizes calculated values concerning the length Δl of the wiring structure as shortened when the shape of the conventional wiring structure, which has the width w and the bent portion having a bending angle Θ (FIG. 2A), is changed to the shape of the wiring structure of the present invention (FIG. 2B).

FIGS. 4A and 4B show known shapes of wiring structures bent at the right angle, and FIGS. 4C and 4D show shapes of wiring structures having improved bent portions.

FIG. 5A shows a known shape of a wiring structure which connects two wiring structures aligned in parallel, and FIGS. 5B and 5C show shapes of wiring structures having improved bent portions.

BEST MODE FOR CARRYING OUT THE INVENTION

Figure 1:
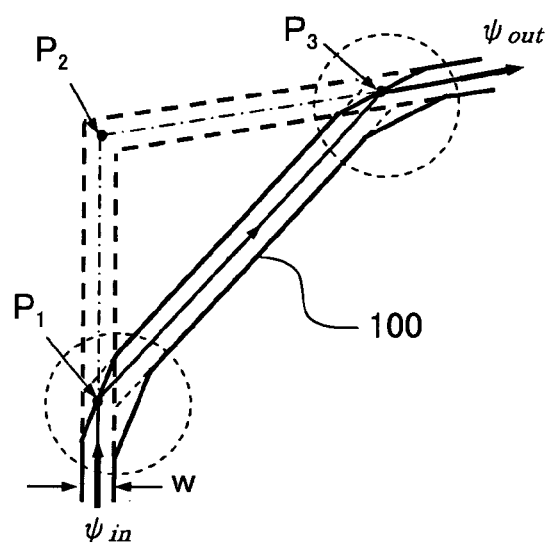
FIG. 1 shows a wiring structure 100 according to a first embodiment of the present invention.
Figure 2:
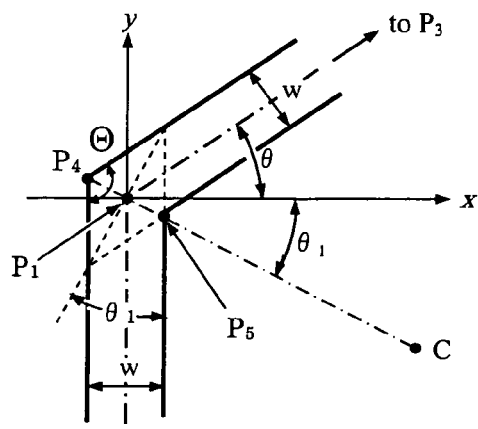
FIG. 2A shows a shape of a conventional wiring structure of a bent portion at a point $P_1$ in relation to a wiring structure 101C shown in FIG. 16.
FIG. 2B shows a shape of a bent portion at the point $P_1$ of the wiring structure 100 shown in FIG. 1.
FIG. 2C shows a shape of another wiring structure which substitutes the shape of the wiring structure of the bent portion shown in FIG. 2B.
Figure 2:
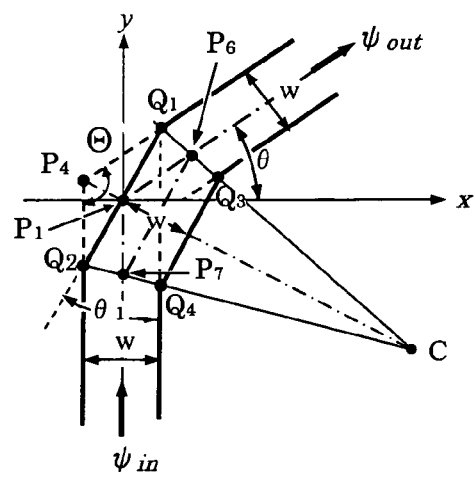
Figure 2:
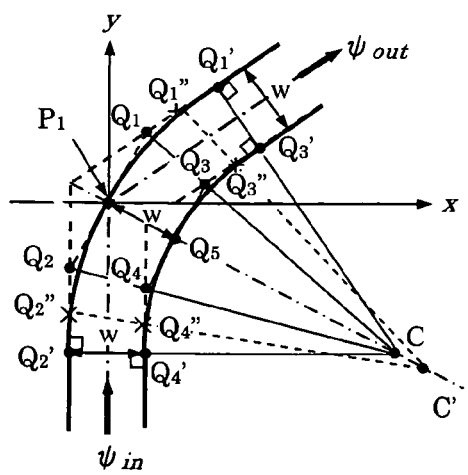
Figure 6:
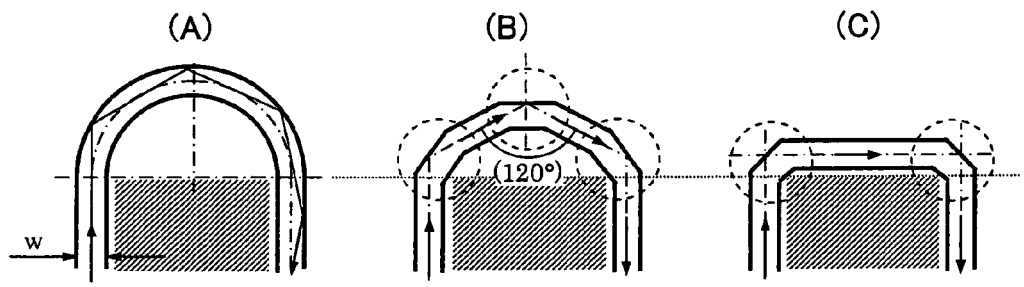
FIGS. 6A and 6C show known shapes of U-shaped wiring structures.
FIG. 6B shows a shape of a wiring structure having an improved bent portion.
Figure 7:
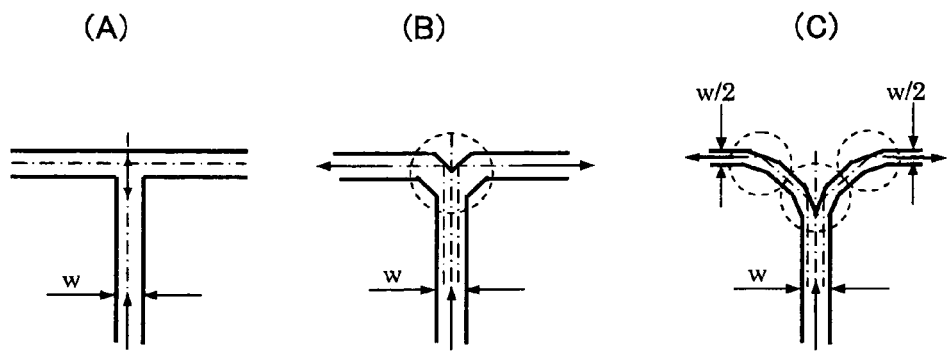
FIG. 7A shows a known shape of a wiring structure having a T-shaped branch.
FIGS. 7B and 7C show shapes of wiring structures having improved branched portions.
Figure 8:
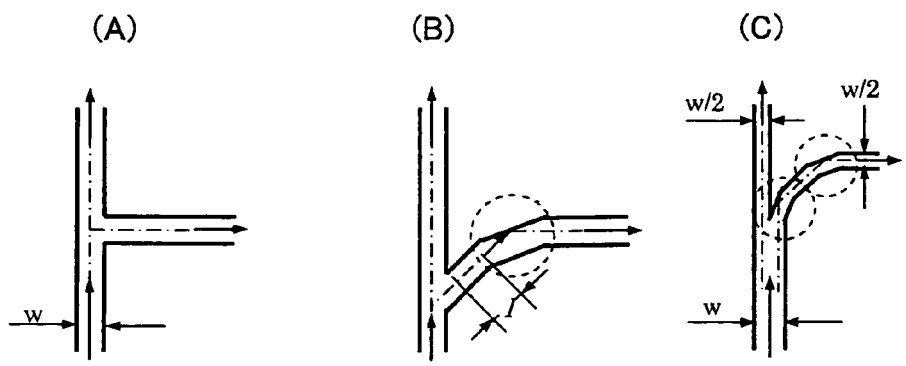
FIG. 8A shows a known shape of another wiring structure having a T-shaped branch.
FIGS. 8B and 8C show shapes of wiring structures having improved branched portions.
Figure 9:
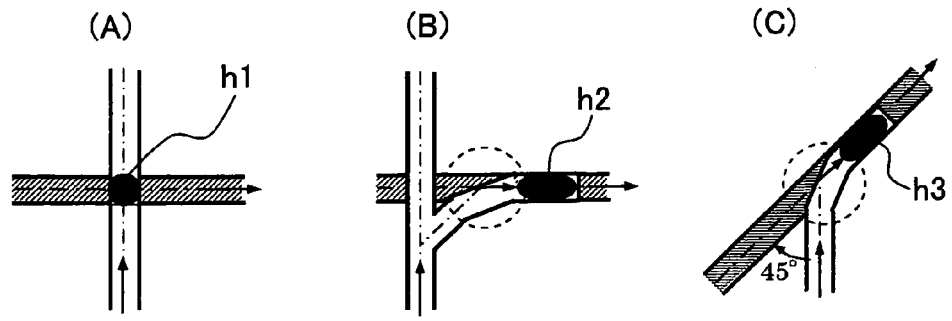
FIG. 9A shows a known example illustrating such an arrangement that wiring structures, which belong to different layers in the multilayered wiring structure, are connected via a through-hole.
FIG. 9B shows an arrangement in which an improved bent portion is applied to the multilayered wiring structure shown in FIG. 9A.
FIG. 9C shows an arrangement in which an improved bent portion is applied to another known multilayered wiring structure, respectively.
Figure 10:
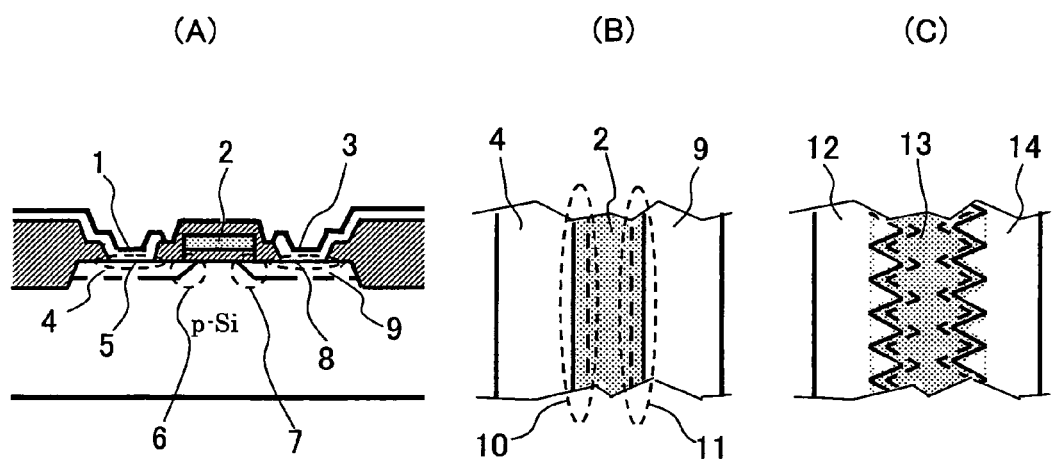
FIG. 10A shows a sectional view of a conventional NMOS-FET.
FIG. 10B shows a plan view of the conventional NMOS-FET.
FIG. 10C shows a plan view of an improved NMOS-FET.
Figure 11:
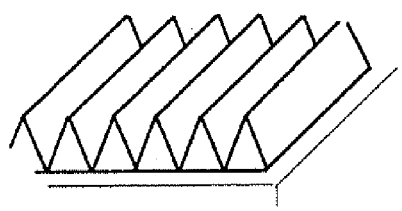
FIGS. 11A to 11D show shapes of projections provided on interfaces of different electronic materials respectively.
Figure 11:
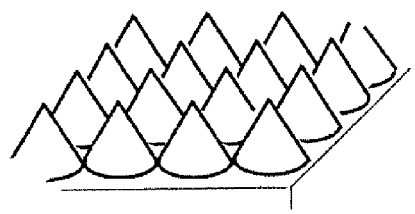
Figure 11:
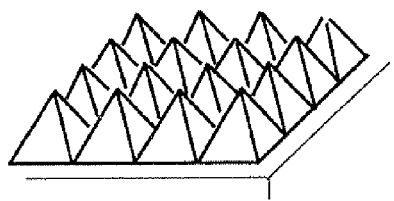
Figure 11:
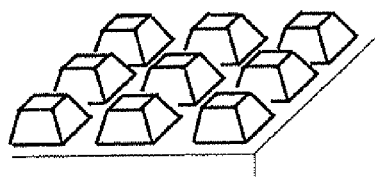
Figure 12:
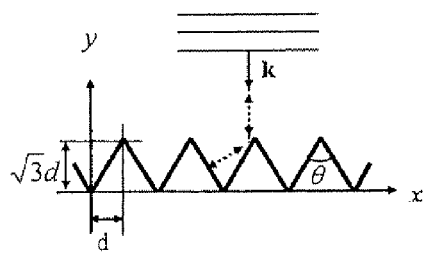
FIG. 12A shows a sectional view of the projections shown in FIG. 11A.
FIG. 12B shows a sectional view of other projections having the same surface areal size as that of the projections shown in FIG. 12A.
Figure 12:
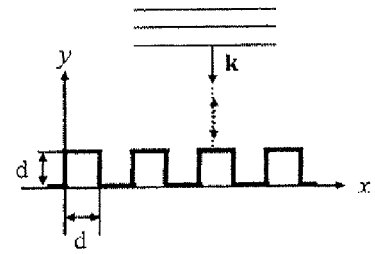
Figure 13:
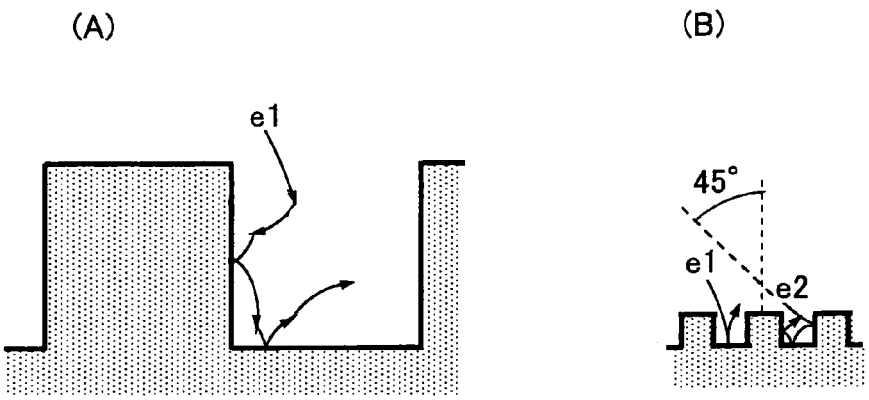
FIG. 13A shows projections having a size which is several times the mean free path of electrons.
FIG. 13B shows projections having a size which is smaller than the mean free path of the electrons.
Figure 14:
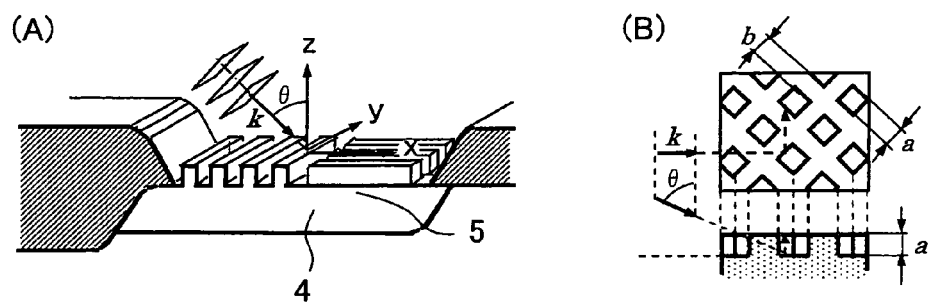
FIG. 14A shows preferred microscopic structures.
FIG. 14B shows another preferred microscopic structure.

At first, an explanation will be made about the wave nature (wave-particle duality) of an electron as the concept indispensable to understand the present invention.

For example, it is assumed that the electron performs the drift motion in a conductor having any electric potential gradient. In this case, the electron is obviously regarded as the particle. Therefore, the philosophy, which is applied to design the portion relevant to the present invention, is the basic property possessed by the electron, i.e., the wave-particle duality, rather than any complex theory of quantum mechanics.

In quantum mechanics, in general, a free electron in motion is definitely expressed by using a wave packet. The wave packet represents a spatial probability amplitude distribution to find out one electron. Therefore, the group velocity as the velocity of propagation of the wave packet is coincident with the velocity v of the electron. One electron behaves as the probability wave before being observed, and it behaves as the particle upon the observation. Therefore, the wave-particle duality as described above is called the complementary duality. However, in the case of the complementary duality, the behavior of the electron during the motion is too abstract, which cannot be utilized for the design intended in the present invention.

The concept of a matter wave or phase wave was presented by de Broglie in 1923 two years before quantum mechanics was established (see, for example, L. de Broglie, Nature Vol. 112, 540 (1923)). In this paper, de Broglie showed the three principles in relation to phase waves. That is, (a) a rest matter particle with mass $m_0$ is associated with a periodic phenomenon at a frequency $v=m_0c^2/h$, (b) the phase of a phase wave generated in an inertial system (inertial frame) by uniform velocity motion (translational motion) of the matter particle is the same as the phase of the periodic phenomenon, and (c) a phase wave does not carry energy. Since a phase velocity as the propagation velocity of the phase wave given by $c^2/v>c$ is faster than the velocity of light, the phase wave cannot carry any energy. Further, in the sense that the oscillation (at a frequency $v=m_0c^2/h$) of the rest matter particle with mass $m_0$ becomes the source of the phase wave, the phase wave is clearly a relativistic wave. Different from a probability wave defined in a mathematical space, the phase wave is generated and propagated in an inertial system in accordance with the motion of the particle. Therefore, it is also considered that the phase wave may really exist. Let the phase wave be called a "de Broglie wave" named after the proposer. In quantum mechanics, the wavelength of the probability wave is called the de Broglie wavelength as well. However, the de Broglie wavelength in this case has been considered to have no relation to the reality. In the case of this model for the behavior of the particle, the electron as the particle in motion and the de Broglie wave to lead the electron come to exist simultaneously. Therefore, the wave-particle duality can be referred to as the "simultaneous complete duality". When the simultaneous duality is taken into account, it is possible to provide such a concrete picture that the de Broglie wave is accompanied with the electron which performs the drift motion. Therefore, this picture can be utilized to design the macroscopic structure portion of an electronic circuit.

The electron moves while performing the drift motion under the electric potential gradient in the electronic circuit composed of the conductor and the semiconductor. The average distance, by which the electron travels between the first scattering and the next scattering during the drift motion, is called "mean free path". In this way, in the case of the model of the microscopic motion of the electron in the electronic circuit, the electron is basically regarded as the particle. Therefore, when the de Broglie wave is accompanied with the motion of the electron following every individual scattering, the microscopic picture is obtained for the motion of the electron based on the simultaneous duality. Since the velocity of the drift motion is an average velocity of the motion of each individual electron, it is possible to build a bridge between the microscopic picture and the macroscopic picture. That is, the phase velocity of the average de Broglie wave is appropriately defined as $c^2/v$ by using the average velocity v of the motion of each individual electron. In the present invention, the macroscopic structure can be designed in consideration of the three elements relevant to the simultaneous duality, i.e., (1) a microscopic motion of each individual electron as a particle, (2) an average motion of each individual electron having the average velocity, and (3) a propagation of an average de Broglie wave.

First, an explanation will be made with reference to FIGS. 1 to 9 about the designing method to improve the characteristics of individual bent portions and the branched portions of wiring structures included in an electronic circuit by applying the concept of the simultaneous duality comprising electrons and an average de Broglie wave to precede the electrons.

First Embodiment

In the case of a straight wiring structure which is linearly symmetrical in relation to the center line, electrons travel in the direction of the center line of the wiring structure in average in accordance with the electric potential gradient in the wiring structure. The average direction of motion of the electrons is coincident with the direction of the center line. Therefore, the average de Broglie wave, which precedes the electrons, goes straight ahead while allowing the wave number vector stands at the center of the wavefront to coincide with the center line. More simply speaking, the average de Broglie wave can be represented by a single light ray which goes straight ahead on the center line. However, the light ray in this case is different from any ordinary light ray, because the propagation velocity exceeds the velocity of light. When bent corners and/or branched portions of wiring structures are designed, in general, an important guideline is to minimize the number of times of reflection of the average de Broglie wave by the walls (boundary lines) of the wiring structures, for the following reason. That is, when a wiring structure is designed as described above, it is expected that the number of times of collision of an electron with the wall of the wiring structure may be minimized as well.

Other than the above, the mean free path of electrons should be taken into consideration in relation to an electronic circuit having a high degree of integration. The mean free path of the electrons in the metal is about 0.1 μm (100 nm) at 0° C., while the mean free path is about 50 nm at room temperature which is a half thereof. Therefore, although the situation depends on the electric potential gradient in a wiring structure, the wiring structure, which has a width of not more than about 100 times the mean free path of the electrons, i.e., not more than about 10 μm, on the basis of the value at 0° C., provides a criterion of the wiring structure for which a relevant portion is to be designed in consideration of the mean free path.

The basic philosophy will be explained with reference to FIG. 16 when a bent corner of a wiring structure is designed on the basis of the simultaneous duality.

Figure 16:
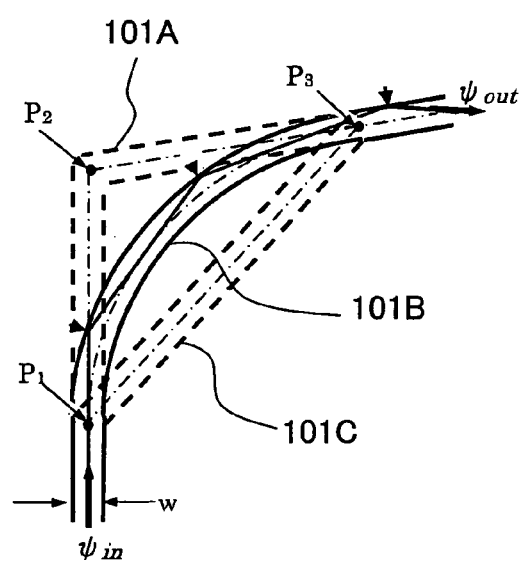
FIG. 16 shows conventional wiring structures.

FIG. 16 shows an exemplary conventional technique in relation to the shape of a bent corner of a wiring structure. A wiring structure 101A shown in FIG. 16 is a basic example of the shape of the conventional wiring structure. When the center line of the wiring structure 101A having a width w is depicted by one-dot chain lines, the wiring structure 101A has the center line obtained by connecting, with straight lines, three points $P_1$, $P_2$, $P_3$ which are not present in any identical straight line, while using $P_2$ as a point of intersection. A wiring structure 101B, which has, as the center line, a circular arc to connect $P_1$ and $P_3$ as shown in FIG. 16, is exemplified as another example of the conventional wiring structure as well. Additionally, a wiring structure 101C, which has the center line to connect $P_1$ and $P_3$ by the shortest distance, is also a conventional wiring structure. The wiring structure 101B is advantageous in that the length of the wiring structure is shortened. However, the shape of the wiring structure 101A or the wiring structure 101C, which has the straight or linear outline, is rather frequently used in LSI circuits. For example, when the shape of the wiring structure 101C is hardly adopted in view of the layout, the shape of the wiring structure 101A is used.

In view of the minimization of the number of times of reflection of the average de Broglie wave, the wiring structure 101B has an advantage which is superior to such an advantage that the wiring length is shortened as compared with the wiring structure 101A. In the wiring structure 101A, the light ray, which represents the average de Broglie wave $\psi_{in}$ to come into the straight wiring that arrives at $P_1$, travels along the center line of the straight wiring to pass through $P_1$ and $P_2$. When the light ray is reflected by the wall which is approximately positioned on the front, the light ray is once returned toward the direction in which the light ray has originally come. Therefore, the following electrons may be also reflected by the front wall. Therefore, it is difficult for such electrons to immediately enter the straight wiring which connects $P_2$ and $P_3$, when the width of the wiring structure is more narrowed, for the following reason. That is, if the width w is sufficiently larger than the mean free path of electrons, each individual electron easily turns the corner, because a certain component of the momentum is generated to direct the traveling direction of the electron to the direction toward $P_3$ in accordance with the electric potential gradient in the wiring structure at the corner disposed at $P_2$. On the contrary, in the case of the wiring structure 101B, only the three positions, which are indicated by triangular symbols in FIG. 16, are such positions that the light ray, which represents the incident average de Broglie wave $\psi_{in}$ going straight, is reflected by the wall until the light beam is allowed to go out as $\psi_{out}$ at the straight portion disposed beyond $P_3$. Further, in general, the traveling direction of $\psi_{out}$ is not coincident with the direction of the center line of the second straight portion. In the case of the wiring structure 101C, the wiring length is the shortest, because $P_1$ and $P_3$ are connected by the straight line. However, in contrast thereto, the number of times of reflection is extremely increased at the wall of the wiring structure at each of the bent corners positioned at $P_1$ and $P_3$, as compared with the wiring structure 101B.

The difference between the motion of the electrons and the motion of the average de Broglie wave will be explained in more detail by using the example of the wiring structure 101C. When the electrons are positioned at the straight portion to arrive at $P_1$, the average direction of motion of each of the individual electrons is coincident with the direction of the center line. Therefore, the light ray of superluminal speed, which represents the average de Broglie wave to precede the electrons, goes straight ahead on the center line. Therefore, even when the electrons are still positioned at the straight portion to arrive at $P_1$, the light ray, which represents the average de Broglie wave, arrives at the straight portion disposed beyond $P_3$, while being reflected by the wall of the wiring structure. Subsequently, when the electrons arrive at the straight portion beyond $P_1$ to arrive at $P_3$, the component of momentum in the direction toward $P_3$ is generated by being influenced by the electric potential gradient. Therefore, the component in the direction toward $P_3$ is also generated in the wave number vector of the average de Broglie wave. If the distance between $P_1$ and $P_3$ is about 100 times the mean free path of electrons, i.e., from 10 μm (0° C.) to 5 μm (room temperature), each of the electrons, which arrives at a position immediately before $P_3$, will have the momentum vector in the direction of the center line. The traveling direction of the light ray, which represents the average de Broglie wave associated with such the electrons, is also coincident with the center line. If so, the situation, which is exactly the same as the situation brought about when the average de Broglie wave $\psi_{in}$ comes into the bent corner at $P_1$, is reproduced at the position immediately before the bent corner positioned at $P_3$. Therefore, the light ray, which represents the average de Broglie wave, is reflected many times by the wall of the wiring structure beyond $P_3$. Consequently, the local heat generation may be caused at the two bent corners of $P_1$ and $P_3$.

FIG. 1 shows a wiring structure 100 of the present invention which reduces the heat generation caused by the two bent corners at $P_1$ and $P_3$ in the conventional wiring structure 101C shown in FIG. 16. In the case of the wiring structure 100 of the present invention, the wiring length is slightly shorter than that of the wiring structure 101C having the shortest wiring length, simultaneously with which the number of times of reflection at the wall is only two at $P_1$ and $P_3$ until the light ray, which represents the average de Broglie wave $\psi_{in}$ that travels through the straight wiring to arrive at $P_1$, is allowed to go out as $\psi_{out}$. This number of times is the smallest number of times of reflection in the wiring structures which pass through $P_1$ and $P_3$. Further, unlike the wiring structure 101B shown in FIG. 16, the light ray, which represents the average de Broglie wave $\psi_{out}$, is coincident with the center line of the straight portion disposed beyond $P_3$. When the number of times of collision of the electron with the wall is decreased, the effect to lower the resistance value is obtained. Therefore, it is possible to suppress the heat generation and the deterioration of the rising and falling characteristics of the signal.

As described above, in order to design the shape of a wiring including a plurality of bent portions, it is basically necessary to consider both of the propagation of the average de Broglie wave and the mean free path of electrons. However, when the bent corner is limited to one, the following basic guideline of the design is available. That is, according to this basic guideline, the design is made so that the average de Broglie wave, which is propagated along the center line through the first straight wiring portion disposed before the bent corner, is propagated along the center line through the second straight wiring portion continued to the bent corner, after passing through the portion of the bent corner.

The wiring structure 100 shown in FIG. 1 has the two similar bent corners as surrounded by circles depicted by broken lines. In particular, the way of designing the wiring shape of the bent corner at the point $P_1$ will be explained with reference to FIGS. 2A and 2B. FIG. 2A shows a shape of a bent corner in a conventional wiring structure, and FIG. 2B shows a shape obtained by improving the shape of the bent corner shown in FIG. 2A in accordance with the present invention. It is assumed that the point $P_1$ is the origin of the xy coordinate system, i.e., $(x, y)=(0, 0)$, and the angle of the bend of the wiring structure at the point $P_1$ is $\pi > \Theta \geq \pi/2$. Assuming that $\theta$ represents the angle formed by the center line to connect $P_1$ and $P_3$ and the x axis, $\Theta = \pi/2 + \theta$ holds. Assuming that $\angle Q_2Q_1Q_4$ is $\theta_1$ in FIG. 2B, $\theta_1 = \pi/4 - \theta/2 = \pi/2 - \Theta/2$ is obtained. Only the xy coordinates of the four points $Q_1$, $Q_2$, $Q_3$, $Q_4$ are shown below while skipping the details of lengthy calculations.

$$Q_1: (x_1, y_1) = \left(\frac{w}{2}, \frac{w}{2\tan\theta_1}\right) \quad [\text{Eq. 1}]$$

$$Q_2: (x_2, y_2) = \left(-\frac{w}{2}, -\frac{w}{2\tan\theta_1}\right)$$

$$Q_3: (x_3, y_3) = \begin{pmatrix} \frac{w}{2}(4\cos\theta_1 - 1), \\ \frac{w}{2\sin\theta_1}(4\cos^2\theta_1 - \cos\theta_1 - 2) \end{pmatrix}$$

$$Q_4: (x_4, y_4) = \left(\frac{w}{2}, \frac{w}{2\sin\theta_1}(\cos\theta_1 - 2)\right)$$

A consideration will now be made about an isosceles triangle $P_1P_6P_7$ having an apex of $P_1$. The xy coordinates of $P_6$ and $P_7$ are determined beforehand by using the foregoing expressions to provide the xy coordinates of the four points $Q_1$, $Q_2$, $Q_3$, and $Q_4$. The length of the center line of the conventional wiring shape at the bent portion is given by twice the one side $P_1P_6$ of the isosceles triangle $P_1P_6P_7$, i.e., $2P_1P_6$. On the contrary, the length of the center line of the wiring structure at the bent portion of the present invention is given by $P_6P_7$. Therefore, the following expression is obtained assuming that $\Delta l$ represents the wiring length shortened as compared with the conventional wiring shape by using the wiring shape of the present invention at the bent portion.

$$\Delta l = 2P_1P_6 - P_6P_7 = \frac{w}{\sin\theta_1}(1 - \cos\theta_1), \theta_1 = \frac{1}{2}(\pi - \Theta) \quad [\text{Eq. 2}]$$

According to the above equation, it is appreciated that the wiring length $\Delta l$ to be shortened is proportional to the width w of the wiring structure, and the larger the angle $\Theta$ of the bend is, the shorter the wiring length $\Delta l$ is. In this way, the length $\Delta l$ to be shortened is the function of the angle $\Theta$ of the bend and the width w of the wiring structure. Therefore, results of the calculation of $\Delta l$ for several specified examples are shown in FIG. 3. In FIG. 3, two sample types of $\Theta=100°$ and $\Theta=135°$ are provided for the angle of the bend, and three sample types of w=10 μm, w=1 μm, and w=0.5 μm are provided for the width of the wiring structure.

When the length of the wiring structure is shortened by the amount of the wiring length $\Delta l$, the resistance value of the wiring structure is directly reduced corresponding to the amount. Therefore, if n individuals of similar or equivalent bent portions are present in the wiring structure, then the total length of the wiring structure to be shortened is $n\Delta l$, and n times of the resistance value is reduced as well. The reduction of the resistance value resides in an effect of classical electromagnetism. Therefore, the effect is conveniently referred to as a "macroscopic effect".

Without being limited to only the macroscopic effect described above, a microscopic effect, which reduces the resistance caused by the collision between an electron and the wall of the wiring structure at the bent corner of the wiring structure, is also present in the wiring structure shape of the present invention. The smaller the width w of the wiring structure is, the relatively larger the microscopic effect is, while the situation depends on the magnitude of the electric potential gradient as well.

The designing method, which is the same as or equivalent to the above, is also applicable to the wiring structure shape of the bent corner at the point $P_3$ of the wiring structure 100 shown in FIG. 1. That is, the straight line, which passes through $P_1$ and $P_3$, is appropriately designated as a new y axis, and the point $P_3$ is designated as the origin of a new xy coordinate system. Therefore, when this designing method is used, it is possible to design any arbitrary wiring structure having a polygonal line shape. In this way, this designing method is also appropriate for the design based on the use of computers. In the example of designing shown in FIG. 2B, it is assumed that the incident light ray, which travels on the center line (y axis) of the first straight portion in which the average de Broglie wave $\psi_{in}$ comes, is reflected at the point $P_1$ on the reflecting surface represented by the line segment $Q_1Q_2$. On this assumption, the line segment $Q_1Q_2$ is determined so that the reflected light beam travels on the center line of the second straight portion. In this case, it is appropriate to consider that the line segment $Q_1Q_2$ represents the cross section of a plane mirror. In order to make the two center lines of the first straight portion and the second straight portion, which make an intersection at $P_1$, represent the light ray incident on $P_1$ and the reflected light ray at this point, the reflecting surface including $P_1$ is not necessarily limited to the plane mirror.

FIG. 2C shows an example in which a plane mirror for a reflecting surface including $P_1$ is replaced with a cylindrical mirror. In FIG. 2C, a curved line, which connects three points $Q_1'$, $P_1$, $Q_2'$, is a circular arc having its center of a point C. When the circular arc is regarded as a cross section of the cylindrical mirror, then the incident light ray, which travels on the center line (y axis) of the first straight portion, is reflected at the point $P_1$, and the reflected light ray thereof is coincident with the center line of the second straight portion in which the average de Broglie wave $\psi_{out}$ is allowed to go out. In this case, a center of a small circular arc to connect three points $Q_3'$, $Q_5$, and $Q_4'$ is also the point C. In relation thereto, the xy coordinate of the point C is given by the following equation.

$$(x_c, y_c) = \left(\frac{w\cos\theta_1}{2(1 - \cos\theta_1)}, -\frac{w\sin\theta_1}{2(1 - \cos\theta_1)}\right) \quad [\text{Eq. 3}]$$

This designing method is also appropriate for the design based on the use of computers. The wiring structure shape, which is based on the use of the curved line, is not limited to the example described above. Only another example will be shown. The following wiring structure shape also satisfies the relationship between the incident light ray and the reflected light ray as described above, wherein a circular arc $Q_1''P_1Q_2''$, which connects three points of a point $Q_1''$ which is indicated by a cross mark affixed on a line segment $Q_1'Q_1$, the point $P_1$, and a point $Q_2''$ which is indicated by a cross mark affixed on a line segment $Q_2Q_2'$ and which has its center of a point C' on the straight line to pass through the point C, is an outer boundary, and a small circular arc $Q_3''Q_5Q_4''$, which connects three points of a point $Q_3''$ which is indicated by a cross mark affixed on a line segment $Q_3'Q_3$, a point $Q_5$, and a point $Q_4''$ that is indicated by a cross mark affixed on a line segment $Q_4Q_4'$ and which has its center of the point C', is an inner boundary line. Therefore, it is appreciated that an infinite number of wiring structure shapes, which satisfy the relationship as described above, exist.

The general designing method for designing the wiring structure shape at the bent portion described above can be easily applied to design any actual wiring structure shape relevant, for example, to an LSI circuit etc. For this purpose, it is necessary to explain the values of a tolerance in this designing method in relation to the wiring structure at the bent portion beforehand. In the most preferred design, the two center lines of the first straight portion and the second straight portion, which intersect at $P_1$, represent the light ray which comes into $P_1$ and the reflected light ray which is reflected at this point. In the case of the exemplary design shown in FIG. 2B, the range of the tolerance is specified by ±w/4 that are defined as the distances of the line segment $Q_1Q_2$ from $P_1$, where the length of the line segment $Q_1Q_2$ is also changed depending on the change of the distances ±w/4. In this case, the reflected light ray travels parallel to the center line of the second straight portion, although this ray is separated by the distance w/4 from the center line. In the case of the exemplary design shown in FIG. 2C, for example, the range of the tolerance is specified by ±w/8 that are defined as the distances of the circular arc $Q_1'Q_2'$ from $P_1$, where the radius of curvature of the circular arc $Q_1'Q_2'$ is also changed depending on the change of the distances ±w/8. In this case, the reason, why the range of the tolerance is more strict than that of the case of FIG. 2B, is that the traveling direction of the reflected light ray certainly has a slight angle with respect to the center line of the second straight portion. Further, when the present invention is introduced into the production process of an LSI circuit, it is enough to merely change wiring structure shapes on the mask. Therefore, the increase in the production cost for every one piece of the LSI circuit is equal to zero. The wiring structure shape of the bent portion, which has the feature as described above, can be applied to any wiring structure of any other different shape having a bent corner.

FIGS. 4A to 4D show shapes before the improvement and after the improvement in relation to the portion bent at the right angle of the wiring structure. The respective arrows indicate the directions in which the electrons are allowed to advance. Therefore, it is appropriate to approve that the average de Broglie wave, which is accompanied with electrons, also goes straight ahead in the direction of the arrow. FIG. 4A shows a wiring structure before the improvement. The perpendicular wall exists at the position disposed beyond the straight advance of the average de Broglie wave. Therefore, the average de Broglie wave is reflected at that position, and the average de Broglie wave hardly enters the wiring structure disposed beyond the bend at the right angle. FIG. 4B shows a simplest example of the improvement. It is assumed that obstacles are present at a hatched portion, and it is impossible to form any wiring in the hatched portion. This wiring structure shape is easily obtained by providing $\theta=0$, $\theta_1=\pi/4$ in FIG. 2A. However, the shape of the wiring structure shown in FIG. 4B is already known (see Japanese Patent Application Laid-open No. 6-005782). FIG. 4C. shows a shape of the wiring structure when there is no obstacle. This shape is generally used in order that the total length of the wiring structure is shortened as much as possible. The wiring structure shapes at two positions, which are enclosed respectively by broken line circles, are determined on the basis of the designing method shown in FIG. 2B. FIG. 4D shows a shape in which the linear wiring portion indicated by L1 is omitted from the shape of the wiring structure shown in FIG. 4C. In FIG. 4D, an average de Broglie wave is bent perpendicularly by two times of reflection at $P_2$ and $P_3$. However, the length of the line segment $P_1P_2$ is not necessarily equal to the length of the line segment $P_1P_3$. However, when they have the same length, the length can be calculated to be about 1.85w. In this way, it is possible to design the wiring structure shape at any arbitrary bent portion which resembles the bent corner shown in FIG. 4D.

FIG. 5A shows a conventional wiring structure shape in which the center line of the straight portion is deviated laterally by a distance d. This wiring structure is bent rightwardly at a point $P_1$ on the center line of the straight portion disposed on the input side, and the wiring structure is bent leftwardly at a point $P_2$ to be parallel to the original straight portion. FIGS. 5B and 5C show examples in which this wiring structure shape is improved by using the designing method of the present invention. In the wiring structure shown in FIG. 5B, a light ray, which represents an average de Broglie wave, travels on the center line, and this light beam is reflected at the points $P_1$ and $P_2$. The wiring structure, which is depicted by solid lines in FIG. 5C, has such a shape that the straight portion, which is indicated by L2 in the wiring structure shown in FIG. 5B, is omitted. However, the distance of the lateral deviation, which is provided between the straight portion (first straight portion) disposed on the input side and the straight portion (second straight portion) disposed on the output side, is smaller than d. The wiring portion, which is depicted by dotted lines, indicates a wiring structure shape in which the distance d of the lateral deviation is maintained. In this case, a light ray, which represents an average de Broglie wave, is reflected at the points $P_1$ and $P_2'$. However, the width of the wiring structure of the oblique portion to connect the first straight portion and the second straight portion is wider than w. In any case, the average de Broglie wave on the output side travels along the center line of the second straight portion.

FIG. 6A shows a conventional wiring structure having a U-shaped form. FIGS. 6B and 6C show examples in which this wiring structure shape is improved by using the designing method of the present invention. In any case, an average de Broglie wave on the output side travels along the center line of the wiring structure. However, the wiring structure shape shown in FIG. 6C is obtained by applying the exemplary conventional technique shown in FIG. 4B.

In all of the examples of the improvement described above, flat surfaces are used as reflecting surfaces for individual average de Broglie waves. That is, the wiring structure shapes of the respective bent portions enclosed by the broken line circles are basically determined on the basis of the designing method explained with reference to FIG. 2B. However, a wiring structure shape can be also determined in accordance with the designing method which is based on the use of the reflection by a cylindrical surface shown in FIG. 2C, in place of the reflection by these flat surfaces as described above. In particular, in the case of the wiring structure shown in FIG. 4D, the contour lines, which are composed of the four line segments at the two bent portions enclosed by the broken line circles, can be substituted with two circular arcs having the same centers. In any one of the improved wiring structure shapes, the average de Broglie wave, which travels along the center line of the first straight portion disposed on the input side, also travels along the center line in the second straight portion disposed on the output side.

FIGS. 7A to 7C and FIGS. 8A to 8C show wiring structure shapes before the improvement and after the improvement when the designing method for the wiring structure shape at the bent portion described above is applied to the design of other wiring structure shapes having similar bent portions, for example, wiring structure shapes having branched portions.

FIGS. 7A to 7C show shapes before the improvement and after the improvement in relation to wiring portions each branched in a T-shaped form. For the purpose of simplification, a consideration will be made about a case in which electrons allowed to advance from the direction indicated by an arrow are branched at a ratio of 1:1. The wiring structure shown in FIG. 7A is a wiring structure before the improvement. Also in this case, the perpendicular wall confronts the advancing electrons at their front. The de Broglie wave is normally reflected (reflected in the opposite direction). Therefore, the heat generation and the deterioration of the signal waveform occur at this portion. The wiring structure shown in FIG. 7B is a simplest example of the improvement in which the drawing is easily performed for preparing a mask as well. The wiring structure shape, which is disposed at the place enclosed by a broken line circle, is determined on the basis of such a design guideline that an average de Broglie wave is propagated along the center line of each wiring structure.

However, a problem remains such that the width of the wiring structure before the branching is the same as the width of the wiring structure after the branching. FIG. 7C shows a wiring structure shape which is designed even including the widths of the respective wiring structures resulting in solving this problem. Assuming that the thickness of a wiring structure is constant, the cross-sectional area is proportional to the width of the wiring structure. Therefore, in order to branch a number of advancing electrons at 1:1, it is appropriate for simplicity that the wiring width after the branching is made a half of the wiring width before the branching. It is appreciated that the three wiring structure shapes, which are enclosed by broken line circles, are basically determined on the basis of the designing method shown in FIG. 2B. With reference to FIG. 7C, the width of the wiring structure after the branching is not limited to w/2, which may be not less than w/2 and not more than w.

FIGS. 8A to 8C show shapes of other examples before the improvement and after the improvement in relation to the wiring portion branched in a T-shaped form. Also in the case of this wiring structure, it is assumed that a number of electrons allowed to advance in the directions of arrows are branched at 1:1 as well. The wiring structure shown in FIG. 8A is a wiring structure before the improvement. The wiring structure shown in FIG. 8B is a simplest example of the improvement in which the drawing is easily performed for preparing a mask as well. The feature of this wiring structure resides in the way of branching of the wiring structure to be branched in the lateral direction. In the drawing, the length l of the wiring structure immediately after the branching means such a length that an average de Broglie wave, which is propagated in the direction of the center line of the straight portion having the length l, is formed at the terminal end of the same wiring structure. It may be appropriate that the length l is not less than at least about several ten times the mean free path, although the situation depends on the width w of the wiring structure and the electric potential gradient in the wiring structure. In this case, the illustration is made assuming that the length of the straight portion is the length which is necessary and minimum to form the average de Broglie wave as described above at the terminal end of the straight portion. Therefore, this length is also the length which is necessary and minimum to make it possible to apply the designing method shown in FIG. 2B to the portion enclosed by the broken line. The reason, why the wiring structure shown in FIG. 8B is made compact as described above, is that the branched wiring structure shown in FIG. 8A, which illustrates the shape before the improvement, is originally the most compact. If the length l of the straight portion is sufficiently long to be 2l, the branched wiring structure shown in FIG. 8B is composed of wiring portions having four different functions, i.e., a branched portion having a length l, a first straight portion having a length l, a bent portion, and a second straight portion continued thereto. In this case, an average de Broglie wave is propagated in the direction parallel to the center line of the straight portion at the straight portion having the length l continued to the branched portion, and the average de Broglie wave comes into the bent portion. FIG. 8C shows a wiring structure shape in which the widths of the wiring structures before and after the branching are taken into consideration as well. The two wiring structure shapes enclosed by broken line circles are determined on the basis of the designing method shown in FIG. 2B. The widths of the respective wiring structures after the branching can be appropriately determined depending on the branching ratio of the numbers of electrons.

An explanation will be made with reference to FIGS. 9A to 9C about a case in which the wiring structure shape of the present invention is applied to multilayered wiring structures. FIG. 9A shows an example of a conventional multilayered wiring structure. The upper layer wiring structure and the lower layer wiring structure cross perpendicularly to one another. A through-hole h1 is formed to connect the upper layer wiring structure and the lower layer wiring structure. FIGS. 9B and 9C show examples in which the improvement is performed by using the designing method of the present invention. In any case, the traveling direction of an average de Broglie wave of the upper layer wiring structure is the same as the traveling direction of the average de Broglie wave of the lower layer wiring structure in the vicinity of the respective through-holes h2 and h3 each of which has an elliptic opening with a long diameter provided in the direction of the center line of the wiring structure. The shape of the opening of the through-hole is not limited to the elliptic shape. However, it is preferable to adopt such a shape that the length of the wiring structure in the direction of the center line is longer than the length in the direction perpendicular to the center line. Owing to the two features described above, it is possible to smoothly move the electrons from the upper layer wiring structure to the lower layer wiring structure. In the wiring structure shown in FIG. 9C, the angle, which is formed by the upper layer wiring structure and the lower layer wiring structure, is not limited to 45°.

In all of the examples of the improvement described above, a flat surface is used as a reflecting surface for an average de Broglie wave. That is, the wiring structure shape at each place enclosed by a broken line circle is basically determined on the basis of the designing method shown in FIG. 2B. However, as previously shown in FIG. 2C, it is also possible to substitute each of line segments (flat surfaces) with each of circular arcs (cylindrical surfaces). Therefore, at least one of the two line segments as the contour lines of a wiring structure portion enclosed by a broken line circle can be changed to a circular arc in all of the examples of the improvement shown in FIGS. 4 to 9.

The essence of the design, which is common to the design of a wiring structure shape including a polygonal portion, resides in that the number of times of the reflection of an average de Broglie wave at the wall of the wiring structure is decreased as much as possible, the average de Broglie wave travels along the center line of the straight wiring structure disposed on the outgoing side in the same manner as on the incoming side, and the total length of the wiring structure is shorted as much as possible as well by frequently using the shortcuts. The reflection phenomenon is reversible in relation to the incoming and outgoing directions. Therefore, even if all of the arrows, which indicate the traveling directions of electrons or an average de Broglie wave, are inverted to be in the opposite directions in the examples described above, the improvement in the characteristics is provided in the same manner as described above. Therefore, the examples can be also applied to any wiring structure of any AC circuit. Even in the case of any complicated wired portion in any actual LSI circuit, the improvement can be provided entirely by following the examples described above and/or modifying and combining the examples in conformity with the purpose. The advance of the high density of the LSI circuit and the tendency of the low current for the driving current will be continued in future not only in view of the high speed signal processing but also in view of the energy saving and the resource saving. It is affirmed that the priority is excessively given to the advance of the high density for the circuit as described above, and the shape of the wiring portion is fixedly considered and almost left to stand until now.

When the wiring structure shape as described above is adopted, the effect acts in only such a direction that the heat generation and the deterioration of the signal are suppressed. Therefore, it is possible to respond to the signal processing at a higher speed with a current value lower than that used at present. The wiring structure shape as described above can be easily transcribed to a large amount of masks by preparing a mother mask by means of a drawing apparatus and transferring the mother mask. When such a mask is installed to an exposure apparatus such as a mask aligner or a stepper, the present invention can be incorporated into the ordinary LSI circuit mass production process. Therefore, it is unnecessary to develop any new technique. When the X-ray exposure will be used in future, it is also possible to adopt the wiring structure shape as described above for an X-ray exposure mask. The wiring structure shape as described above can be also easily adopted in an electronic circuit production process based on the use of an electron beam drawing apparatus and an electron beam exposure apparatus.

The means of the improvement in the wiring structure shape described above is not limited, for example, to an IC, an LSI circuit, etc. which can be also applied to a circuit having a larger scale, for example, any wiring portion on a printed circuit board, for the following reason. That is, the effect to shorten the wiring structure given by the foregoing expression (Δl) is necessarily obtained. Further, the wiring length Δl to be shortened is proportional to the width of the wiring structure. Therefore, the larger the width of the wiring structure is, the larger the shortening amount of the wiring structure is.

Second Embodiment

Even when the signal transmission characteristic is improved for only wiring portions of an LSI circuit, if the stay of electrons occurs at a connecting surface between the wiring portion and each of the devices such as the transistors incorporated into the LSI circuit, then the effect of the improvement of the wiring portion is consequently suppressed. Further, in order to improve the characteristic of the entire LSI circuit, it is also necessary to improve the signal transmission characteristic at the boundary surface between materials of different types in each of the devices. An explanation will be made below with reference to FIGS. 10 to 15 about a method for improving the signal transmission characteristic at the boundary surface between the materials of the different types as described above, by applying the concept of the simultaneous duality consisting of electrons and an average de Broglie wave which precedes the electrons.

FIG. 10A shows a sectional view illustrating a conventional NMOSFET. This transistor is used as an example to explain the arrangement which improves the signal transmission characteristic at an interface of a joined surface between a metal electrode formed of, for example, Al or Cu and a source or drain electrode composed of a Si diffusion layer and at an interface between the source or drain electrode and a Si substrate.

As shown in FIG. 10A, the transistor has a metal electrode 3 which is composed of, for example, Al or Cu and which is connected to a source electrode 9 for the carrier (hole) implantation, a metal electrode 1 which is connected to a drain electrode 4 for the leading, and a gate electrode 2 which is composed of a poly-Si film subjected to the ion implantation. The portion, in which the cross section is hatched, is an insulating film. Each of the source electrode 9 and the drain electrode 4 is the n+ layer. Joined surfaces 5, 8 between the metal electrode and the semiconductor electrode are flat, at which the electric conductivity is suddenly changed. Therefore, a de Broglie wave, which is associated with an electron allowed to move in the direction opposite to that of the positive hole, is easily reflected thereby. Therefore, even when the electron comes into such a joined surface, the electron does not necessarily pass therethrough once. Hence the reflection and the reentry may be repeated several times in some cases. If the number of times of repetition of the incidence and the reflection is increased, then the stay of the electrons arises, and the heat generation in a larger amount and the deterioration of the signal waveform are invited. Unless even a part of the de Broglie wave is transmitted through the joined surface toward the semiconductor side, the electron cannot enter the semiconductor side as well.

In order to suppress the reflection of the electron associated with the de Broglie wave as described above, fine and minute recesses and projections are provided on the surface of the semiconductor side of the joined surfaces 5, 8 between the metal electrode and the semiconductor electrode so that the incident de Broglie wave is diffusely reflected and/or transmitted and absorbed. FIGS. 11A to 11D show four examples of schematic diagram each depicting microscopic structures as described above. FIG. 11A shows one-dimensional structures on the joined surface, and FIGS. 11B to 11D show two-dimensional structures on the joined surfaces. The ratio of the height to the size of the bottom surface of each of the microscopic structural members is referred to as the "aspect ratio". When the height is large, i.e., when the aspect ratio is large, it is more effective to diffusely reflect and/or transmit and absorb the de Broglie wave. In each of the microstructural members, it is preferable that the apex portion is sharp (see FIGS. 11A to 11C). Further, as shown in FIG. 11B, it is preferable that the joined surface itself does not remain. More comprehensively, it is desirable to adopt a structure such as the structure of the wall surface of the so-called non-reverberant room. The microstructure shown in FIG. 11C resembles the wall surface structure. However, in view of the production technique, it is difficult to prepare such a microstructural member having the sharp apex as shown in FIGS. 11A to 11C. On the contrary, it is relatively easy to prepare the microstructural members each having the flat top portion as shown in FIG. 11D. The shape of such microscopic structures enlarges the areal size of the joined surface between the metal electrode and the semiconductor electrode. Therefore, the current may be allowed to flow with ease in a certain viewpoint. However, rather than the analog effect based on classical electromagnetism as described above, the increase in the transmission probability in a digital manner is obtained on the basis of the behavior of each individual electron having the simultaneous duality and the microscopic structural members as described above. This fact will be explained with reference to FIGS. 12A and 12B.

FIG. 12A shows a sectional view of the microscopic structures shown in FIG. 11A. It is assumed that the original joined surface lies on the x axis. The cross section of the individual structure is an isosceles triangle (regular triangle). It is assumed that the length of the base is 2d, and the apex angle θ is 60 degrees. The total of the two sides except for the base is 4d. Therefore, the areal size of the surface of the microscopic structures is twice the areal size of the original joined surface. When the de Broglie wave comes perpendicularly to the x axis from the upper position, then the de Broglie wave is reflected three times by the microscopic structure surface, and the de Broglie wave is returned to the originally coming direction. If only one electron of ten electrons which come into the flat joined surface can pass through the joined surface, then the number of electrons allowed to pass through is three by providing the microscopic structures, and the three times transmittance is obtained. The microscopic structures shown in FIG. 12B is another microscopic structures having the same areal size as that of the structures shown in FIG. 12A. In this case, even when the de Broglie wave comes perpendicularly to the x axis from the upper position, the de Broglie wave is reflected once and returned upwardly. Therefore, only one electron of ten electrons is allowed passing through the joined surface, and the situation is the same as that of the case in which the microscopic structures are absent. As described above, the effect of the microscopic structures of the present invention does not directly depend on the large or small areal size thereof. The effect depends on only the number of times of the reflection, i.e., the number of times of the reflection of the incident de Broglie wave until the de Broglie wave is returned to the originally coming direction. In the microscopic structures shown in FIG. 12A, if the apex angle θ is 90 degrees, the number of times of the reflection is decreased to two. The reason, why the large aspect ratio is preferred, is that it is intended to increase the number of times of the reflection.

When a bunch of needles, each of whose point has an extremely large aspect ratio, is prepared, then the light incident on the bunch is not returned to the originally coming direction even when the reflection occurs many times in the bunch. Therefore, the point of the design of the microscopic structures resides only in the degrees of the apex angle θ. If the apex angle θ is not less than 120 degrees, there is no meaning at all, because the reflection occurs only once. It is necessary that the apex angle θ is not more than 90 degrees to cause the reflection at least twice. If the apex angle θ is not more than 60 degrees, the reflection may occur three times or more, which is more preferred.

However, each of the microscopic structures shown in FIGS. 11A to 11C involves difficulty in the processing, because the top of it is pointed. For the purpose of simplification, it is assumed in the examples shown in FIGS. 12A and 12B that the de Broglie wave is allowed to come perpendicularly from the position disposed just thereover. However, in the case of the actual electronic circuit formed on the flat substrate, an average de Broglie wave is propagated rather in a flat plate-shaped waveguide as considered in the design of a wiring structure as well. The following fact will be understood with ease. That is, if the de Broglie wave is allowed to come in the oblique direction, the side surfaces may contribute to the increase in the number of times of reflection even in the case of the microscopic structures each having a flat top portion as shown in FIG. 12B, which are to be easily prepared. FIG. 11D shows an example of the microscopic structures having the flat top portions arranged two-dimensionally on the joined surface.

It has been demonstrated that the microscopic structures are appropriately designed in consideration of the direction of incidence of an average de Broglie wave. An explanation will be further made with reference to FIGS. 13A and 13B about the fact that the size of a microscopic structure should be determined in relation to the mean free path of electrons. FIG. 13A shows such a situation that an electron e1 is allowed to come slightly obliquely from the upper-left position into a structure in which the aspect ratio is 1 and the length of one side has a dimension that is several times the mean free path of the electrons. Since this projection-recess structure is larger compared with the mean free path, the following situation may occur. That is, the electron, which is included in the electrons coming into the recess and its portion disposed in the vicinity of a side surface of the recess structure, has the traveling direction which is bent by the drift motion. The electron is reflected firstly on the side surface, the electron is immediately directed toward the bottom surface, and the electron is reflected secondly thereon. The fact, which is intended to be demonstrated in this section, is as follows. That is, if the structure has the dimension which is about several times the mean free path, the side surface of the projection-recess structure may also contribute to the increase in the number of times of reflection per unit time of the incident electron. A consideration will be made about a case in which the projection-recess structure is sufficiently large. It is assumed that the mean free path of electrons in the metal at 0° C. is 100 nm. On this assumption, if the size of one side is at least several ten times the mean free path, it is approved that the projection-recess structure is sufficiently large. Assuming that several ten times the mean free path is fifty times to sixty times the mean free path, the size of such one side is at least 5 μm to 6 μm, which arrives at a macroscopic size. In relation to the electrons allowed to come into the recess, the ratio of the electrons allowed to come into the portion disposed in the vicinity of the side surface of the structure is considerably decreased. However, the traveling direction is bent to the side surface direction not only by the drift motion but also by the electric field. The number of electrons firstly reflected thereon is increased. However, a situation, in which such electrons are immediately reflected by the bottom surface as well, is hardly caused. Therefore, this scarcely contributes to the increase in the number of times of reflection per unit time. On the contrary, FIG. 13B shows such a situation that an electron e1 is allowed to come slightly obliquely from the upper-left position into a structure in which the aspect ratio is identically 1 and the length of one side has a dimension of about ½ to ⅓ of the mean free path of the electrons. When the inclination is small and the incidence is approximate to the perpendicular incidence, then the electron arrives at the bottom of the groove by one time of the drift motion or by one free path, and the electron is reflected to fly out from the groove. However, in the case of an electron e2 which has an angle of incidence of 45° from the beginning, the reflection may be caused three times on the right side surface, the bottom surface, and the left side surface of the groove during one time of the free path. For the purpose of simplification, it is premised that the reflection is caused three times. Accordingly, the transmission probability (transmittance) per mean free time at the interface at which the projection-recess structure is provided is twice the transmission probability to be brought about at the simple flat surface boundary. If the length of one side is 30 nm to 50 nm, it is not difficult so much to prepare the microscopic structures as described above. It is also possible to further increase the transmittance per unit time by increasing the aspect ratio. In relation thereto, in the case of the sufficiently large projection-recess structure, even if the angle of incidence is 45°, it is approved that the transmittance per unit time is approximately slightly larger than the transmittance to be brought about at the simple flat surface boundary. As described above, the following fact is appreciated. That is, even when the cross-sectional shape of fine projection-recess structures is a rectangular wave, if an average de Broglie wave is allowed to come obliquely, then the effective transmittance of the electron may be greatly increased. The transmittance depends on the velocity of the electron, and hence it depends on the driving voltage as well. The increase in the effective transmittance means the decrease in the driving voltage.

FIG. 14A shows a situation in which the microscopic structures shown in FIG. 13B are provided on the upper surface of the semiconductor electrode 4 of a NMOSFET shown in FIG. 10A. An average de Broglie wave, which is propagated in an unillustrated metal electrode, is allowed to come from an obliquely upward position into the grating or lattice surface arranged in parallel to the y axis at an angle of incidence of 45°. An electron, which comes from the identical direction, may cause the reflection three times in the groove by means of one free path. Therefore, this situation contributes to the improvement in the transmittance. For the purpose of reference, a grating structure, which is arranged in parallel to the x axis, is also shown. As appreciated easily, even in the case of the same grating structure, when the grating structure is rotated by 90° about the z axis, it is impossible to expect any great improvement in the transmittance. If the angle of incidence θ of the average de Broglie wave (angle formed by the wave number vector and the z axis) is larger than 45°, then the effect is obtained equivalently to the effect which is to be obtained by increasing the aspect ratio of each individual microscopic structure, and it is possible to improve the transmittance. As described above, when the microscopic structures are designed, those extremely important are (1) the relationship between the spatial structure of the fine recesses and projections and the direction of propagation of the incident average de Broglie wave, and (2) the relationship between the size or dimension of the projection-recess structure and the mean free path of electrons.

FIG. 14B shows a plan view and a side view depicted by cutting out a part of preferred microscopic structures adopted when the angle of incidence is not less than 64.8°. In FIG. 14B, it is assumed that both of the length and the height of a minute quadratic prism are "a", and the width "b" of a groove disposed between the quadratic prisms satisfies b=a. When it is premised that the reflection is caused three times within one mean free path, the angle θ, which is formed by the wave number vector k of the average de Broglie wave and the normal line established on the original boundary surface before providing the microscopic structures, is given by the following expression.

$$\tan\theta \geqq 1.5\sqrt{2} \quad \text{[Eq. 4]}$$

Therefore, $\theta \geqq 64.8°$ is obtained. Assuming that one mean free path is 100 nm, the reflection may be caused three times on the surface of the microscopic structures provided that $a \leqq 21$ nm is given. However, in the calculation described above, it is assumed that the trajectory of an electron in one mean free path is linear for the purpose of simplification. The areal size of the grooves is three times the areal size of the top surfaces of the quadratic prisms. Therefore, the transmittance of each individual electron per mean free time is 2.5 times that to be obtained when the interface is flat. When the width b of the groove between the quadratic prisms is made narrower than a, it is possible to make θ to be not more than 64.7°.

As described above, when the appropriate microscopic structures are provided at the joined interface between the metal electrode and the semiconductor electrode, it is possible to improve the transmittance per unit time as included in the meaning as described above, although the essential transmittance at the interface is unchanged. As a result, the rising and falling characteristics of the signal are improved, the bit rate is raised in an amount corresponding thereto, and it is possible to realize a high speed processing. Further, the resistance value is apparently lowered at the interface. Therefore, it is possible to lower the driving voltage required to maintain the same current value, and it is possible to realize the energy saving as well.

The method of the present invention, which improves the signal transmission characteristic at the joined surface between the metal electrode and the semiconductor electrode, is not limited to an NMOSFET. The method of the present invention is also applicable other electronic devices including, for example, general semiconductor devices. That is, the electronic device referred to herein is exemplified by respective devices including, for example, photoelectric conversion, display, and light emission devices in addition to devices inherent in electrons including, for example, transistors, ICs, and LSI circuits.

Next, an explanation will be made with reference to FIGS. 10A to 10C about the arrangement to improve the signal transmission characteristic at the interface between the semiconductor electrode and the Si substrate.

In FIG. 10A, the metal electrodes 1, 3 are connected to the drain electrode 4 and the source electrode 9. The gate electrode 2 is composed of an ion-implanted poly-Si film. The drain electrode 4 and the source electrode 9 are n+ layers obtained by performing the ion implantation by using the mask of the gate electrode simultaneously with the ion implantation into the gate electrode 2. The hatched portion indicates the SiO$_2$ insulating film. The attention is now focused on boundary portions 6, 7 between the semiconductor electrode and the p-Si substrate indicated by two circles depicted by broken lines. FIG. 10B shows a plan view in which only these portions are extracted. FIG. 10B shows boundary portions 10, 11 between the semiconductor electrode and the p-Si substrate as depicted through the gate electrode 2. The boundaries between the semiconductor electrode and the p-Si substrate are indicated by broken lines respectively. The reflection of the de Broglie wave and the reflection of the electron associated therewith tend to be caused at the linear boundary (surface) as described above.

FIG. 10C shows an example of the method for suppressing the reflection of the de Broglie wave at the boundary portions 10, 11 between the semiconductor electrode and the p-Si substrate. In FIG. 10C, the drain electrode 12 and the source electrode 14 are positioned at the left and the right of the gate electrode 13. The boundary lines, which are disposed at the left and the right of the gate electrode 13, are sawtooth-shaped by improving the linear or the straight forms having been hitherto adopted. When the ion implantation is performed by using the mask of the gate electrode having the edges as described above, the edges of the drain electrode 12 and the source electrode 14, which are disposed below the gate, are also sawtooth-shaped as indicated by broken lines. Unlike the linear boundary having been hitherto adopted, the de Broglie wave is reflected many times at the fine projection-recess portions. Therefore, the effect is obtained to increase the probability of the transmission of the electron. Therefore, the signal transmission characteristic is improved in the semiconductor. The shape of the boundary line is not limited to the regular shape shown in FIG. 10C, which may be irregular. In order to produce the semiconductor device of this embodiment, it is enough to change, for example, only the exposure mask required to form the gate electrode 13. It is possible to easily produce the semiconductor device by using the conventional production process.

The method for improving the signal transmission characteristic in the semiconductor described above is not limited to an NMOSFET as well. The method is also applicable to other electronic devices including, for example, general semiconductor devices. The method for improving the signal transmission characteristic at the joined surface between the metal electrode and the semiconductor electrode already described above is also usable in order to improve the signal transmission characteristic in the device depending on the structure of the electronic device such as the semiconductor device. The microscopic structures are not limited to the shape illustrated in the embodiment described above. Any structure is available provided that the structure has such a surface that the reflection is capable of being caused most preferably at least twice within one mean free path of the incoming or incident electron. A sufficiently preferred effect is obtained even in the case of such a structure that the reflection is capable of being caused at least twice within two or three mean free paths. The mean free path of electrons in the semiconductor differs within a range of about several times depending on the type of the semiconductor. However, in general, the mean free path in the semiconductor is longer than that in the metal, which causes no problem to prepare the microscopic structures. It is clear that the method as described above is not only applicable to the electronic device but also applicable to any joined portion of materials of different types included, for example, in wiring structures. Further, even when the method is used for the joined portion of materials of the same type with the interface existing therebetween, it is possible to expect such an effect that the contact resistance is effectively reduced.

As described above, when the reflection of the de Broglie wave is suppressed to facilitate the transmission and the absorption at the joined surface between the metal and the semiconductor device and at the interface between the materials of the different types in the electronic device, the effect is provided to suppress the heat generation and the signal deterioration which would be otherwise caused by such surfaces. When the heat generation and the signal deterioration caused by the electronic device are reduced owing to the effects as described above, then it is possible to decrease the number of electrons to form one digital signal, and it is possible to consequently increase the transmission velocity (bit rate) of the signal as well. The effects of the present invention as described above also make it possible to further decrease the driving current of the electronic device. Therefore, it is of course possible to make diversion to the reduction of the electric power consumption.

Figure 15:
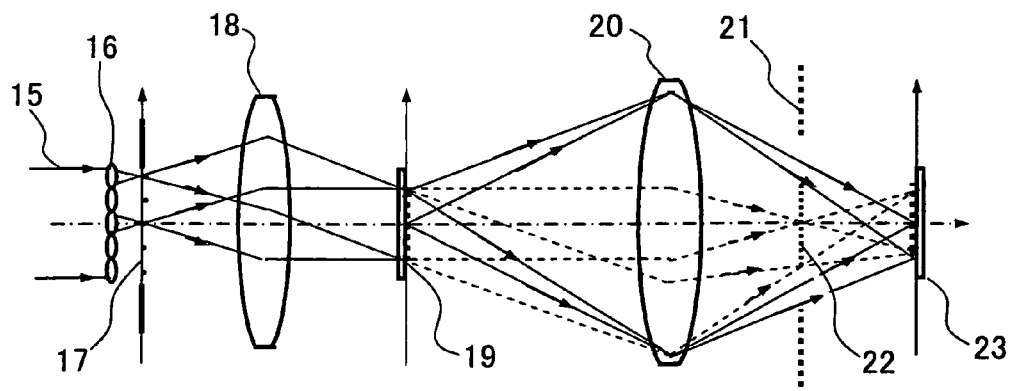
FIG. 15 schematically shows a mask pattern projection optical system (semiconductor exposure apparatus).

The various types of novel wiring structure shapes described in the first embodiment can be incorporated into the ordinary LSI circuit mass production process such that the wiring pattern, which has the wiring structure shape as described above, is formed on a mask, and the mask is installed to the semiconductor exposure apparatus. Also in the second embodiment, any desired semiconductor device can be mass-produced such that a mask is prepared to provide the microscopic structures at the interface between the different types of electronic materials, and the mask is installed to the semiconductor exposure apparatus. FIG. 15 shows an outline of such a semiconductor exposure apparatus. In FIG. 15, an excimer laser is used for an unillustrated light source. A light beam 15 from the light source illuminates a fly's eye lens 16 to serve as a homogenizer. Arrays of point light sources formed by individual fly's eye lens elements are used as a secondary light source plane 17. Respective divergent light beams from the secondary light source plane 17 are allowed to pass through a condenser lens 18 to uniformly illuminate a mask 19 therewith. The illuminated mask pattern is imaged by a projection lens 20 on a wafer 23 which is coated with the photoresist. If the mask is not placed, the secondary light source plane 17 is imaged as depicted by a dotted line 22 in an exit pupil 21 of the projection lens. This light source image 22 is called an "effective source". When the size of the image of the effective source 22 is smaller than the size of the exit pupil 21 as shown in the drawing, the partial coherent illumination is provided.

It is possible to apply various changes to the concrete contents of the description of the embodiments described above, without deviating from the concept or the scope of the present invention.

INDUSTRIAL APPLICABILITY

Even when the semiconductor device having the high degree of integration is used and/or even when the extremely fine wiring structure is used in order to increase the degree of integration of the circuit, then it is possible to suppress the heat generation of the circuit, and it is possible to achieve the reduction of the electric power consumption by using the wiring structure and the electronic device of the present invention.

The invention claimed is:

1. A wiring structure comprising:
   a first straight portion which extends in a first direction with a first width on both sides of a first center line extending in the first direction;
   a second straight portion which extends in a second direction, different from the first direction, with a second width on both sides of a second center line extending in the second direction; and
   a bent portion which has a predetermined width and which connects one end of the first straight portion and one end of the second straight portion so that an angle formed by the first direction and the second direction is more than 90 degrees and less than 180 degrees,
   wherein the first center line of the first straight portion and the second center line of the second straight portion intersect at an outer edge long portion of the bent portion which defines the predetermined width.

2. The wiring structure according to claim 1, wherein an angle formed by the first center line and the outer edge long portion is equal to an angle formed by the second center line and the outer edge long portion.

3. A wiring structure comprising:
   a first straight portion which extends in a first direction with a first width on both sides of a first center line extending in the first direction;

a second straight portion which extends in a second direction, different from the first direction, with a second width on both sides of a second center line extending in the second direction; and a branched portion which has a predetermined width and which connects an edge portion disposed on one side of the first straight portion and an edge portion disposed on one side of the second straight portion so that an angle formed by the first direction and the second direction is not less than 90 degrees and less than 180 degrees, wherein a subsidiary center line in the first straight portion parallel to the first center line of the first straight portion and the second center line of the second straight portion intersect at an outer edge long portion of the branched portion which defines the predetermined width.

4. The wiring structure according to claim 3, wherein an angle formed by the outer edge long portion and the subsidiary center line parallel to the first center line is equal to an angle formed by the second center line and the outer edge long portion.

5. The wiring structure according to claim 1, wherein a shape of the outer edge long portion is a straight line.

6. The wiring structure according to claim 1, wherein a shape of the outer edge long portion is a curved line.

7. A wiring structure comprising:
a first straight portion which extends in a first direction with a first width on both sides of a first center line extending in the first direction;

a second straight portion which extends in a second direction, different from the first direction, with a second width on both sides of a second center line extending in the second direction; and a bent portion which has a curved form, which has a predetermined width, and which connects one end of the first straight portion and one end of the second straight portion so that an angle formed by the first direction and the second direction is 90 degrees, wherein the first center line of the first straight portion and the second center line of the second straight portion intersect at an outer edge long portion of the bent portion which has the curved form defining the predetermined width.

8. The wiring structure according to claim 1, wherein the wiring structure is a wiring structure which is provided in an LSI circuit.

9. A mask which is attachable to a semiconductor exposure apparatus, comprising a two-dimensional pattern which is provided to prepare the wiring structure as defined in claim 8.

10. An electronic device comprising:
a first portion which is composed of a first electronic material having a first electric conductivity;
a second portion which is composed of a second electronic material having a second electric conductivity and which is arranged in contact with the first electronic material; and
an interface at which the first portion and the second portion make contact with each other,
wherein when the direction of propagation of the average wave to averagely represent a plurality of electrons moving in the first portion is determined, projection-recess structures are formed on the interface, and each of the projection-recess structure has such a surface or surfaces in which each of the electrons, moving individually in parallel to a direction of propagation of the average wave, is reflectional at least not less than twice within two or three mean free paths of the electrons when the electron comes into one of the recesses of the projection-recess structure.

11. The electronic device according to claim 10, wherein on the surface or the surfaces of the projection-recess structures, each of the electrons is reflectional at least not less than twice within one mean free path of the electrons.

12. The electronic device according to claim 10, wherein the first electronic material is a metal forming an electrode, and the second electronic material is a semiconductor.

13. The electronic device according to claim 10, wherein each of the recesses or a projections concerning the projection-recess structures formed on the interface has a triangular cross-sectional shape, and an apex angle of the triangle is not more than 90 degrees.

14. The electronic device according to claim 13, wherein the apex angle of the triangle is not more than 60 degrees.

15. The electronic device according to claim 10, wherein each of the projections concerning the projection-recess structures formed on the interface has a quadrilateral cross-sectional shape, and $h/d \geqq 1$ is satisfied provided that d represents a length of a base of a quadrangle and h represents a height of the quadrangle.

16. The electronic device according to claim 10, wherein the projection-recess structures formed on the interface have a periodic structure, and a short period, in periods of the periodic structure, is not more than 0.1 μm.

17. The electronic device according to claim 16, wherein the projection-recess structures formed on the interface have a one-dimensional periodic grating structure, and a direction, in which individual gratings of the grating structure extend, is perpendicular to a direction of a vector which is obtained by projecting, onto the interface, a wave number vector k representing a direction of propagation of the average wave.

18. The electronic device according to claim 16, wherein the projection-recess structures formed on the interface have a two-dimensional periodic grating structure, and a direction, which relates to one of the dimensions of the two-dimensional periodic grating structure, forms 45 degrees with respect to a direction of a vector which is obtained by projecting, onto the interface, a wave number vector k representing a direction of propagation of the average wave.

19. A mask which is attachable to a semiconductor exposure apparatus, comprising a pattern with which the projection-recess structures, provided in the electronic device as defined in claim 10, are prepared.

20. The wiring structure according to claim 3, wherein a shape of the outer edge long portion is a straight line.

21. The wiring structure according to claim 3, wherein a shape of the outer edge long portion is a curved line.

22. The wiring structure according to claim 3, wherein the wiring structure is a wiring structure which is provided in an LSI circuit.

23. A mask which is attachable to a semiconductor exposure apparatus, comprising a two-dimensional pattern which is provided to prepare the wiring structure as defined in claim 22.

24. The wiring structure according to claim 1, further comprising:
a branched portion which extends in the second direction with the second width on both sides of the second center line branched in the second direction so that an angle formed by the first direction and the second direction is more than 90 degrees and less than 180 degrees in the form that the longer width of the branched portion achieves about several ten times an electrons mean free path or more;

a third straight portion which extends in a third direction, different from the second direction, with a third width on both sides of a third center line extending in the third direction; and a second bent portion which has a predetermined width and which connects one end of the branched portion and one end of the third straight portion so that an angle formed by the second direction and the third direction is more than 90 degrees and less than 180 degrees, wherein the second center line of the branched portion and the third center line of the third straight portion intersect at an outer edge long portion of the second bent portion which defines the predetermined width.

25. The wiring structure according to claim 24, wherein the first center line of the first straight portion and the third center line of the third straight portion intersect at 90 degrees.

* * * * *